(12) United States Patent
Kubera et al.

(10) Patent No.: US 11,837,672 B2
(45) Date of Patent: Dec. 5, 2023

(54) STACKED MULTIJUNCTION SOLAR CELL HAVING A DIELECTRIC INSULATING LAYER SYSTEM

(71) Applicant: AZUR SPACE Solar Power GmbH, Heilbronn (DE)

(72) Inventors: Tim Kubera, Leingarten (DE); Bianca Fuhrmann, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/007,517

(22) Filed: Aug. 31, 2020

(65) Prior Publication Data
US 2021/0066516 A1    Mar. 4, 2021

(30) Foreign Application Priority Data

Aug. 29, 2019    (DE) ...................... 10 2019 006 096.2

(51) Int. Cl.
*H01L 31/00*    (2006.01)
*H01L 31/0224*    (2006.01)
(Continued)

(52) U.S. Cl.
CPC .. *H01L 31/02245* (2013.01); *H01L 31/02167* (2013.01); *H01L 31/056* (2014.12); *H01L 31/0687* (2013.01)

(58) Field of Classification Search
CPC .................. H01L 31/02245; H01L 31/02167
See application file for complete search history.

(56) References Cited

U.S. PATENT DOCUMENTS 5,412,249 A    5/1995    Hyugaji et al.
5,425,816 A    6/1995    Cavicchi et al.
(Continued)

FOREIGN PATENT DOCUMENTS

CN    102292825 A    12/2011
CN    103715276 A    4/2014
(Continued)

OTHER PUBLICATIONS

HUO ("Comparison of Ti/Pd/Ag, Pd/Ti/Pd/Ag and Pd/Ge/Ti/Pd/Ag contacts to n-type GaAs for electronic devices handling high current densities"), Semicond. Sci. Technol. 32 (2017) 045006 (9pp) (Year: 2017).*

(Continued)

*Primary Examiner* — Angelo Trivisonno
(74) *Attorney, Agent, or Firm* — Muncy, Geissler, Olds & Lowe, P.C.

(57) ABSTRACT

A stacked multijunction solar cell having a dielectric insulating layer system, a germanium substrate, which forms an underside of the multijunction solar cell, a germanium subcell and at least two III-V subcells, which follow each other in the specified order, the insulating layer system includes a layer sequence made up of at least one bottom insulating layer, which is integrally connected to a first surface section of the multijunction solar cell and a top insulating layer forming an upper side of the insulating layer system, and a metal coating of the multijunction solar cell is integrally and electrically conductively connected to a second surface section abutting the first surface section of the multijunction solar cell and is integrally connected to a section of the upper side of the insulating layer system, and the top insulating layer comprises amorphous silicon or is made up of amorphous silicon.

13 Claims, 2 Drawing Sheets

(51) Int. Cl.
*H01L 31/056* (2014.01)
*H01L 31/0216* (2014.01)
*H01L 31/0687* (2012.01)

(56) References Cited

U.S. PATENT DOCUMENTS

| | | | |
|---|---|---|---|
| 8,203,072 | B2 | 6/2012 | Ko et al. |
| 9,680,035 | B1* | 6/2017 | Chary ............... H01L 31/03048 |
| 2006/0231130 | A1 | 10/2006 | Sharps et al. |
| 2010/0193002 | A1 | 8/2010 | Dimroth et al. |
| 2010/0289103 | A1* | 11/2010 | Yamamoto ............ H01L 31/105 |
| | | | 257/458 |
| 2012/0318349 | A1* | 12/2012 | Shim ............... H01L 31/022425 |
| | | | 136/256 |
| 2013/0220396 | A1 | 8/2013 | Janssen et al. |
| 2014/0076386 | A1* | 3/2014 | King ................. H01L 31/0443 |
| | | | 136/255 |
| 2014/0174518 | A1 | 6/2014 | Wu et al. |

FOREIGN PATENT DOCUMENTS

| | | | |
|---|---|---|---|
| EP | 0528311 | A2 | 2/1993 |
| EP | 1715529 | A2 | 10/2006 |
| EP | 2709168 | A2 | 3/2014 |
| WO | WO 2010/150943 | A1 | 12/2010 |
| WO | WO2019/143776 | A1 | 7/2019 |

OTHER PUBLICATIONS

Stefan Janz et al: "Amorphous Silicon Carbide Rear-Side Passivation and Reflector Layer Stacks for Multi-Junction Space Solar Cells based on Germanium Substrates", 2017 IEEE 44$^{th}$ Photovoltaic Specialist Conference (PVSC), IEEE, Jun. 25, 2007, pp. 83-87, XP033452546, DOI: 10.1109/PVSC.2017.8366389.

C. Chu et al: "Contact Processing Methods for Production III-V Solar Cells" Proceedings of the Photovoltaic Specialists Conference, Louisville, May 10-14, 1993; (Proceedings of the Photovoltaic Specialists Conference), New York, IEEE, US, Bd. Conf. 23, May 10, 1993, pp. 728-734, XP010113162, ISBN: 978-0-7803-1200-3.

J. Fernández et al: "Back-surface Optimization of Germanium TPV Cells" World Conference on Thermophotovoltaic Generation of Electricity, Bd. 890, Nr. 1, Sep. 25, 2006, pp. 190-197, XP002457494.

H. Yoo et al: "Development of Coplanar Back Contact for Large Area Thin, GaAs/Ge Solar Cells" Proceedings of Photovoltaic Specialists Conference. Las Vegas, Oct. 7-11, 1991 (Proceedings of the Photovoltaic Specialists Conference), New York, IEEE, US, Bd. Conf. 22, Oct. 7, 1991, pp. 1463-1468, XP010039150, ISBN: 978-0-87942-636-1.

Oliva et al., "III-V Multi-Junction Metal-Wrap-Through (MWT) Concentrator Solar Cells," 32$^{nd}$ European PV Solar Energy Conf & Exhib., Munich, Germany, pp. 1367-1371 (Jun. 2016).

Chinese Office Action for Chinese Appilcation No. 202010883132.9 dated Apr. 27, 2023 with English Translation.

* cited by examiner

STACKED MULTIJUNCTION SOLAR CELL HAVING A DIELECTRIC INSULATING LAYER SYSTEM

This nonprovisional application claims priority under 35 U.S.C. § 119(a) to German Patent Application No. 10 2019 006 096.2, which was filed in Germany on 29 Aug. 2019, and which is herein incorporated by reference.

BACKGROUND OF THE INVENTION

Field of the Invention

The present invention relates to a stacked multijunction solar cell having a dielectric insulating layer system.

Description of the Background Art

Different methods are known for passivating and metal-coating semiconductor wafers. The desired metal structure is produced on an insulating layer, for example with the aid of a resist mask made from a positive resist or from a negative resist, the metal being applied over a wide area, e.g. by means of physical vapor deposition.

Alternatively, printing methods are used, e.g. screen printing or dispensing heads, which directly apply only the desired metal structure.

To reduce shading of the front side of a solar cell, it is possible to contact the front side from the back side by means of a through-contact opening. Solar cells of this type are also referred to as metal wrap-through (MWT) solar cells.

In addition to different manufacturing methods for the through-contact opening, different metal coating methods are also known, in particular to achieve a reliable insulation and metal coating in the area of the through-contact opening.

An MWT solar cell based on silicon is known from US 2013/0220396 A1. From US 2014/0174518 A1, a likewise silicon-based solar cell structure with an improved passivation layer sequence is known.

An inverted-grown GaInP/AlGaAs solar cell structure having through-contact openings is known from "III-V multi-junction metal-wrap-through (MWT) concentrator solar cells," E. Oliva et al., Proceedings, 32nd European PV Solar Energy Conference and Exhibition, Munich, 2016, pp. 1367-1371, the solar cell structure being epitaxially grown with the p-n junctions, and the through-contact openings being produced only subsequently by means of dry etching. The side surface of the through-opening is then coated with an insulating layer, and the through-contact opening is subsequently galvanically filled with copper.

A solar cell stack made up of multiple III-V subcells on a GaAs substrate with a back side-contacted front side is known from U.S. Pat. No. 9,680,035 B1, a hole extending from the upper side of the solar cell through the subcells and into a not yet thinned substrate layer being produced by means of a wet-chemical etching process and opened downwardly only by thinning the substrate layer.

Prior to thinning, metallic contact surfaces are arranged on the solar cell stack upper side, the abutting upper side as well as the side surfaces of the hole are coated with an insulating layer, and a metal layer is subsequently applied to the metal contact surfaces and the insulating layer.

Titanium is typically used for a good adherence of a metal layer to a dielectric material, e.g. to silicon dioxide or silicon nitride. A reliable and long-lasting adherence to semiconductor layers made from germanium or III-V semiconductors, however, is achieved, for example, with the aid of silver, palladium or gold-germanium.

SUMMARY OF THE INVENTION

It is therefore an object of the present invention to provide a device which refines the prior art.

In an exemplary embodiment of the invention, a stacked multijunction solar cell having a dielectric insulating layer system is provided, the multijunction solar cell including a germanium substrate forming an underside of the multijunction solar cell, a germanium subcell and at least two III-V subcells, which follow each other in the order specified.

The insulating layer system has a layer sequence made of up at least one bottom insulating layer integrally connected to a first surface section of the multijunction solar cell and a top insulating layer forming an upper side of the insulating layer system.

A metal coating is integrally and electrically conductively connected to a second surface section abutting the first surface section of the multijunction solar cell.

The metal coating is also integrally connected to a section of the upper side of the insulating layer system.

The top insulating layer comprises amorphous silicon or is made up of amorphous silicon.

The first surface section and the second surface section can be formed on the upper side of the multijunction solar cell or on the underside of the multijunction solar cell.

The first surface section can be predominantly or completely covered by, for example, at least one silicon dioxide layer comprising a dielectric layer. The second surface section is predominantly or completely covered by a III-V material.

Correspondingly, the surface sections can be formed either by the Ge substrate or by a layer forming the upper side of the semiconductor wafer, e.g. a III-V subcell or a III-V cap layer, i.e. covering layer. In this case, it is understood that in contrast to a metal coating of silicon, a completely different technology has to be used in order to achieve a connection that is as durable and as low-resistance as possible.

A Ge subcell can include germanium or is made up of germanium, a layer made up of germanium also containing substances, possibly in addition to the germanium, in particular dopants or also impurities.

The same also applies to the III-V subcells, which include one or multiple materials of the III as well as the V main group or are made up of such materials.

The amorphous silicon layer ensures a reliable and long-lasting adherence to many different metal coatings. This makes it possible, in particular, to achieve an integral fit between a typical metal coating for semiconductor surfaces, such as, in particular, germanium, but also III-V semiconductor materials, and the dielectric layer.

The entire insulating layer system is easily producible in a single deposition process, e.g. plasma-enhanced chemical vapor deposition, or APCVD, or atomic layer deposition.

An advantage is that the insulating layer system thus does not require any further process steps, and on the other hand, opens up many possibilities for optimizing the manufacturing process as well as with regard to the design of the metal coating, preferably with respect to through-contactings.

In particular, process steps, additional or different metal structures, may be dispensed with. The multijunction solar cell therefore represents a particularly cost-effective and efficient approach.

Another advantage is that in a III-V solar cell stack with a Ge substrate, the metal coating can be formed both on a surface of the insulating layer and on a surface of the III-V solar cell and/or on the surface of the Ge substrate.

The metal layer must therefore reliably and reproducibly form a bond with both the insulating layer and the geranium or III-V surface and also reliably create an ohmic contact with the germanium and/or with the III-V surface.

The bottom insulating layer can comprise $SiO_2$ and/or $Si_3N_4$ or is made up of $SiO_2$ and/or $Si_3N_4$.

The insulating layer system can include at least one further middle insulating layer, the at least one middle insulating layer comprising $SiO_2$ and/or $Si_3N_4$ or being made up of $SiO_2$ and/or $Si_3N_4$. It is understood that the bottom insulating layer includes a different material than the middle insulating layer.

The multijunction solar cell can have a back-contacted front side, the semiconductor wafer can have at least one through-contact hole extending from an upper side of the multijunction solar cell through the subcells to the underside, with a contiguous side wall and an oval circumference in parallel to the surface in cross section, and a side wall of the through-contact hole being covered by the dielectric insulating layer system.

The metal coating on the insulating layer system can extend from the upper side of the multijunction solar cell, along the side wall, through the through-contact hole to the underside of the multijunction solar cell.

The metal coating comprises a multilayer system. Further, the multilayer system can comprise an AuGe/Ti/Pd/Ag/Au layer sequence or a Pd/Au/Ge/Ti/Pd/Ag/Au layer sequence. The AuGe/Ti/Pd/Ag/Au layer sequence, in particular, is a widely used and proven layer sequence for achieving a metal coating on germanium layers.

The Pd/Au/Ge/Ti/Pd/Ag/Au layer sequence, in particular, has proven to be successful for concentrator photovoltaics (CPV). Since Pd has a higher reflectivity or conductivity in the wavelength range of 1 μm to 3 μm, compared to Ti, a further advantage results for the solar cells, due to the so-called "back side reflector."

The multilayer system can have a layer comprising a nickel or a layer comprising an aluminum as the bottom layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus, are not limitive of the present invention, and wherein.

DETAILED DESCRIPTION

Figure 1:
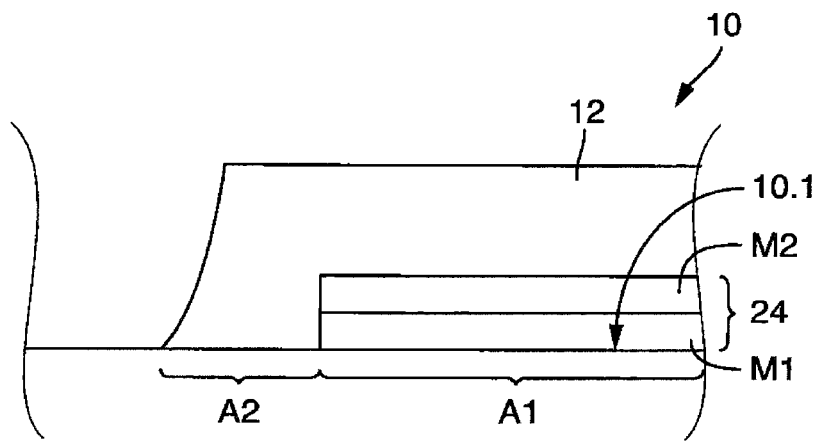
FIG. 1 shows a detail of a first specific embodiment of a multijunction solar cell having a dielectric insulating layer system.

The illustration in FIG. 1 shows a detail of a surface of a stacked multijunction solar cell 10. The surface is formed by a semiconductor layer, e.g. a layer comprising a germanium or a III-V semiconductor. A dielectric insulating layer system 24, made up of a bottom insulating layer M1 and an top insulating layer M2, is on a first surface section A1 of upper side 10.1.

Bottom insulating layer M1 is integrally connected to upper side 10.1 of multijunction solar cell 10. The bottom insulating layer comprises $SiO_2$ and/or $Si_3N_4$ or consists of $SiO_2$ and/or $Si_3N_4$. An upper side of the insulating layer system 24 is formed by top insulating layer M2, top insulating layer M2 being made up of amorphous silicon.

A metal coating 12 is formed on a second surface section A2 abutting first surface section A1 as well as on the upper side of insulating layer system 24. The metal coating is integrally and electrically conductively connected to upper side 10.1 of multijunction solar cell 10. Metal coating 12 is also integrally connected to the upper side of insulating layer system 24, i.e. to amorphous silicon layer M2.

Figure 2:
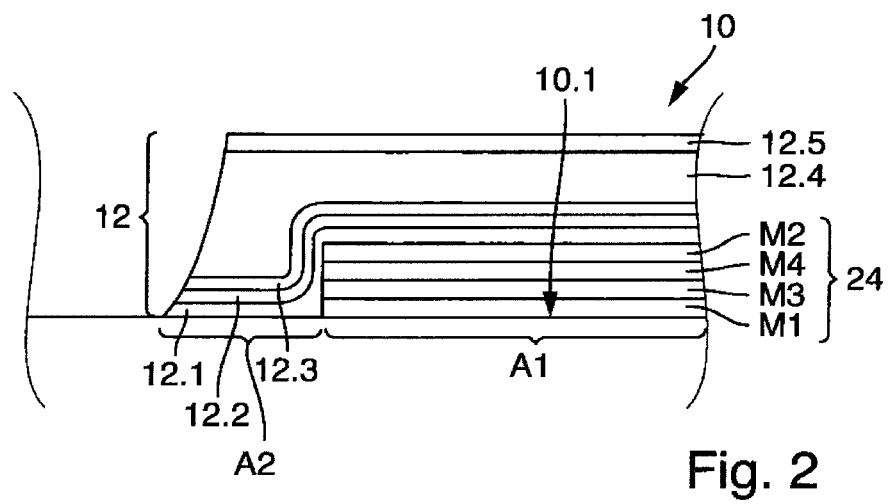
FIG. 2 shows an exemplary embodiment of a multijunction solar cell having a dielectric insulating layer system.

Another specific embodiment is shown in the illustration in FIG. 2. Only the differences from the illustration in FIG. 1 are explained below. The further specific embodiment comprises, as a cutout, part of the surface section A1 and part of the surface section A2.

In the first surface section A1, the dielectric layer sequence 24 comprises two middle insulating layers M3 and M4 between the lowermost insulating layer M1 and the uppermost insulating layer M2.

The two middle insulating layers M3 and M4 each comprise SiO2 and/or Si3N4 or each consist of SiO2 and/or Si3N4. The lower insulating layer M1 here has a different material than at least one of the two middle insulating layers M3 and M4.

In the cutout in the area of the surface section A1, a layer system is formed on the dielectric layer sequence 24 for the metal coating 12 of a layer system of a sequence of five metal layers 12.1, 12.2, 12.3, 12.4 and 12.5 as an AuGe/Ti/Pd/Ag/Au layer sequence or as a Pd/Au/Ge/Ti/Pd/Ag/Au layer sequence, wherein as the first metal layer 12.1 of the layer system, i.e. the AuGe layer or the Pd layer is materially bonded to the surface of the topmost insulating layer M2 of the insulation layer system 24 below. Furthermore, in the area of the surface section A2, the first metal layer 12.1 is materially connected to the electrically conductive semiconductor surface of the multijunction solar cell.

In other words, the sequences of the five metal layers 12.1, 12.2, 12.3, 12.4, and 12.5 cover the upper side of the insulating layer system 24 in the illustrated section on the upper side 10.1, i.e. the surface of the upper insulating layer M2.

Furthermore, in the section shown, the metal coating 12 covers the surface of the multijunction solar cell as part of the surface section A2.

Figure 3:
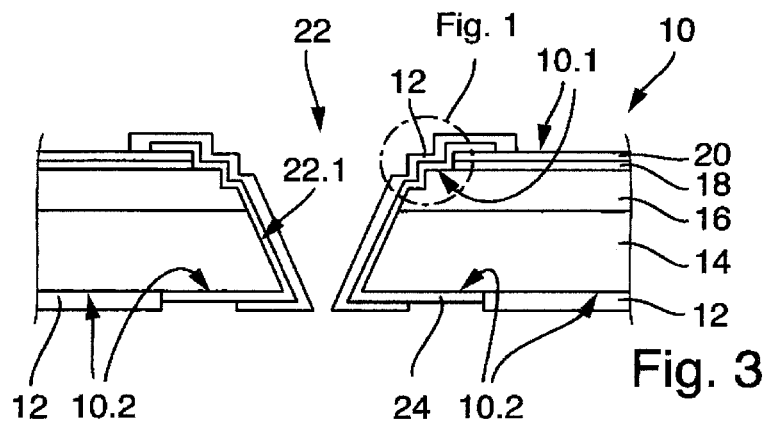
FIG. 3 shows an exemplary embodiment of a multijunction solar cell having a dielectric insulating layer system.

In the illustration of FIG. 3, a cross section through an opening is shown. Only the differences from the illustration in FIG. 1 or from FIG. 2 are explained below.

The stacked multijunction solar cell 10 has an opening 22 with a side wall 22.1. A plurality of III-V subcells 16, 18, and 20 are formed on the Ge substrate 14, which itself is preferably also embodied as a subcell.

The insulating layer system 24 extends from the first surface section A1 over the second surface section A2 on the upper side 10.1 through the opening 22 to the underside 10.2. The opening has a larger diameter on the upper side 10.1 than that of the underside 10.2. In other words, the opening is conical.

Here, the insulating layer system 24 completely covers the side wall 22.1 all around in the opening in order to prevent the metal coating from short-circuiting the individual subcells 14, 16, 18 and 20 in the opening 22.

The metal coating 12 is materially connected to the front side 10.1 of the multijunction solar cell 10 in an electrically conductive manner and then completely covers the insulating layer system 24 arranged on the front side 10.1 and the side surfaces 22.1 of the opening and a part of the insulating layer system 24 on the underside 10.2 to form a rear contact surface on the underside 10.2. This allows for the front side to be connected electrically from the rear side or from the underside 10.2 by means of the rear side contact surface.

On the underside 10.2, an electrically conductive semiconductor rear side, i.e. the rear side of the Ge substrate 12, which is spaced apart by an area of the insulating layer system 24, is also covered by the metal coating 12. As a result, both contacts of the multijunction solar cell can be connected from the underside 10.2.

Figure 4:
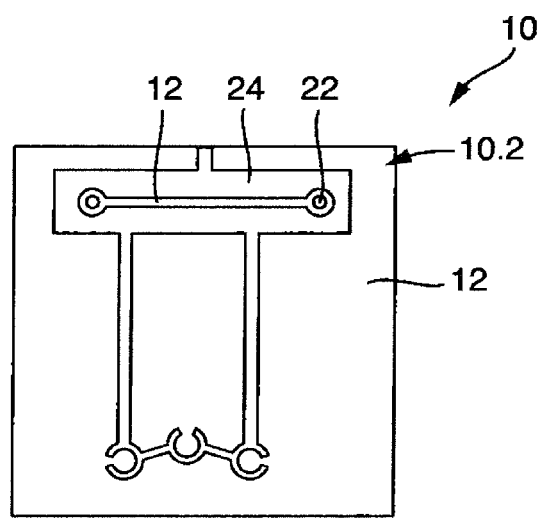
FIG. 4 shows a back side view of the multijunction solar cell.

In the illustration of FIG. 4, a plan view of the underside 10.2 of the embodiment depicted in connection with FIG. 3 is shown. Only the differences from the illustration in FIG. 3 are explained below.

The underside 10.2 of the multijunction solar cell 10 is predominantly, i.e. more than 70%, covered by the metal coating 12 in order to connect the rear side of the multijunction solar cell 10 with low electrical resistance.

The front side 10.1 is connected with two through-contacts, i.e. by means of two openings 22 from the rear side. In this case, the two areas around the openings 22, which are designed as rear-side contacts for the front side 10.1, are electrically connected by means of a conductor track.

For purposes of insulation, the rear-side contact area is separated from the area of the metal coating 12, which electrically connects the rear side of the multiple solar cell 10, by an insulating area.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multijunction solar cell comprising:
a germanium substrate, which forms an underside of the multijunction solar cell;
a germanium subcell;
at least two III-V subcells, which follow each other;
a through-hole passing through the germanium substrate an the at least two III-V subcells to enable a front side of the multijunction solar cell to be contacted from a back side of the multijunction solar cell;
a dielectric insulating layer system integrally extending from a first surface section of the stacked multijunction solar cell at a bottom side of the dielectric insulating layer system over the through-hole passing to an upper side of the dielectric insulating layer system, the dielectric insulating layer system having a layer sequence comprising:
a bottom insulating layer integrally connected to the first surface section of the stacked multijunction solar cell; and
a top insulating layer formed an upper side of the dielectric insulating layer system; and
a metal coating integrally extending from the first surface section of the multijunction solar cell at the bottom side of the dielectric insulating layer system over the through-hole passing to the upper side of the dielectric insulating layer system and integrally and electrically conductively connected to a second surface section of the multijunction solar cell abutting the first surface section of the multijunction solar cell and being integrally connected to a covered section of the upper side of the dielectric insulating layer system, the metal coating contacting the front side of the dielectric insulating layer system and the backside of the dielectric insulating layer system via the through-hole,
wherein the top insulating layer comprises amorphous silicon or is formed substantially of amorphous silicon,
wherein the metal coating is disposed directly on the second surface section of the dielectric insulating layer system, and
wherein an entirety of the metal coating is a continuous, materially homogenous layer and directly contacts the dielectric insulating layer system and a portion of the dielectric insulating layer system on an upper side of the stacked multijunction solar cell is entirely and directly covered by the metal coating layer.

2. The stacked multijunction solar cell according to claim 1, wherein the bottom insulating layer comprises $SiO_2$ and/or $Si_3N_4$ or is made up of $SiO_2$ and/or $Si_3N_4$.

3. The stacked multijunction solar cell according to claim 1, wherein the insulating layer system includes a middle layer comprising $SiO_2$ and/or $Si_3N_4$ or being formed substantially of $SiO_2$ and/or $Si_3N_4$.

4. A stacked multijunction solar cell comprising:
a dielectric insulating layer system having a layer sequence made of up at least one bottom insulating layer integrally connected to a first surface section of the multijunction solar cell and a top insulating layer forming an upper side of the dielectric insulating layer system;
a germanium substrate, which forms an underside of the multijunction solar cell;
a germanium subcell;
at least two III-V subcells, which follow each other;
a through-hole passing through the germanium substrate to enable a front side of the multijunction solar cell to be contacted from a back side of the multijunction solar cell; and
a metal coating integrally extending from the first surface section of the multijunction solar cell at a bottom side of the dielectric insulating layer system over the through-hole to the upper side of the dielectric insulating layer system integrally and electrically conductively connected to a second surface section abutting the first surface section of the multijunction solar cell and being integrally connected to a covered section of the upper side of the dielectric insulating layer system, the metal coating contacting the front side and the backside via the through-hole,
wherein the top insulating layer comprises amorphous silicon or is formed substantially of amorphous silicon,
wherein the front side of the multijunction solar cell is back side-contacted, wherein the through-hole of a semiconductor wafer extends from an upper side of the multijunction solar cell through the at least two Ill-V subcells and the germanium subcell through the underside, the through-hole having a contiguous side wall, an oval circumference in parallel to the surface and an open top and an open bottom, wherein the side wall of the through-hole is covered by the dielectric insulating layer system, wherein the dielectric insulating system integrally extends from the first surface section of the multijunction solar cell at the bottom side of the dielectric insulating system over the through-hole to the upper side of the dielectric insulating system, and wherein an entirety of the metal coating is a continuous, materially homogenous layer and directly contacts the dielectric insulating layer system and a portion of the dielectric insulating layer system on an upper side of the stacked multijunction solar cell is entirely and directly covered by the metal coating layer.

5. The stacked multijunction solar cell according to claim 4, wherein the metal coating on the dielectric insulating layer system extends from the upper side of the multijunction solar cell along the side wall through the through-hole to the under side of the multijunction solar cell.

6. The stacked multijunction solar cell according to claim 1, wherein the metal coating comprises a multilayer system.

7. The stacked multijunction solar cell according to claim 6, wherein the multilayer system comprises an AuGe/Ti/Pd/Ag/Au layer sequence or a Pd/Au/Ge/Ti/Pd/Ag/Au layer sequence.

8. The stacked multijunction solar cell according to claim 7, wherein the multilayer system has a bottom layer comprising nickel or aluminum.

9. The stacked multijunction solar cell according to claim 1, wherein the metal coating comprises a multilayer system, and wherein the multilayer system comprises: AuGe, Ti, Pd, Ag, and Au layers.

10. The stacked multijunction solar cell according to claim 1, wherein the metal coating covers at least 70% of the underside of the multijunction solar cell.

11. The stacked multijunction solar cell according to claim 1, wherein the layer sequence of the dielectric insulating layer system including the bottom insulating layer is disposed directly on the first surface section of the stacked multijunction solar cell.

12. The stacked multijunction solar cell according to claim 4, wherein the metal coating and the dielectric insulating layer system are disposed on a contiguous side wall of the through-hole without filling the through-hole.

13. The stacked multijunction solar cell according to claim 1, wherein the through-hole extends from the upper side of the multijunction solar cell through the at least two III-V subcells and the germanium subcell through the underside of the multijunction solar cell, the through-hole having an open top and an open bottom.

* * * * *